(12) United States Patent
Choi et al.

(10) Patent No.: US 9,093,278 B1
(45) Date of Patent: Jul. 28, 2015

(54) METHOD OF MANUFACTURE OF INTEGRATED CIRCUIT PACKAGING SYSTEM WITH PLASMA PROCESSING

(71) Applicants: JoonYoung Choi, Guwangju-si (KR); Seong Won Park, Icheon-si (KR); KyungOe Kim, Daejeon (KR); Hun Teak Lee, Seongnam-si (KR); SungWon Cho, Icheon-si (KR)

(72) Inventors: JoonYoung Choi, Guwangju-si (KR); Seong Won Park, Icheon-si (KR); KyungOe Kim, Daejeon (KR); Hun Teak Lee, Seongnam-si (KR); SungWon Cho, Icheon-si (KR)

(73) Assignee: STATS ChipPAC Ltd., Singapore (SG)

( * ) Notice: Subject to any disclaimer, the term of this patent is extended or adjusted under 35 U.S.C. 154(b) by 54 days.

(21) Appl. No.: 14/137,352

(22) Filed: Dec. 20, 2013

(51) Int. Cl.
| | | |
|---|---|---|
| *H01L 21/302* | (2006.01) | |
| *H01L 21/461* | (2006.01) | |
| *H01L 23/00* | (2006.01) | |
| *H01L 21/56* | (2006.01) | |

(52) U.S. Cl.
CPC ............... *H01L 24/03* (2013.01); *H01L 21/56* (2013.01); *H01L 24/83* (2013.01)

(58) Field of Classification Search
CPC ........... H01L 2924/01079; H01L 2924/01078; H01L 2924/14; H01L 2924/01029; H01L 2924/01013; H01L 21/31116; H01L 21/31138; H01L 21/32137; H01L 21/32136; H01L 21/3065; H01L 21/31144; H01L 2924/0002; H01L 21/28562; H01L 21/76843; H01L 21/76862; H01L 21/76873; H01L 21/3105; H01L 21/76861; H01L 21/76886; C23C 16/45525; C23C 16/40; C23C 16/406; C23C 16/408; C23C 16/56
USPC .......................................... 438/106, 710, 725
See application file for complete search history.

(56) References Cited

U.S. PATENT DOCUMENTS

| | | | |
|---|---|---|---|
| 6,521,857 | B1 | 2/2003 | Barnett |
| 6,638,855 | B1 * | 10/2003 | Chang et al. ................... 438/637 |
| 7,087,458 | B2 | 8/2006 | Wang et al. |
| 7,273,808 | B1 | 9/2007 | Lin |
| 7,550,314 | B2 | 6/2009 | Odegard et al. |
| 2008/0020570 | A1 * | 1/2008 | Naik ............................. 438/675 |
| 2009/0206728 | A1 * | 8/2009 | Nozawa et al. ................ 313/503 |

* cited by examiner

*Primary Examiner* — Michelle Mandala
(74) *Attorney, Agent, or Firm* — Ishimaru & Associates LLP

(57) ABSTRACT

A method of manufacture of an integrated circuit packaging system including: heating a support structure having a conductive pad and an organic surface protection layer on the conductive pad; removing the organic surface protection layer from the conductive pad by a plasma process with a two-step method, the two-step method includes a first step with a dioxygen and a second step with a dihydrogen, wherein the second step immediately follows the first step; and forming an underfill over the conductive pad.

20 Claims, 12 Drawing Sheets

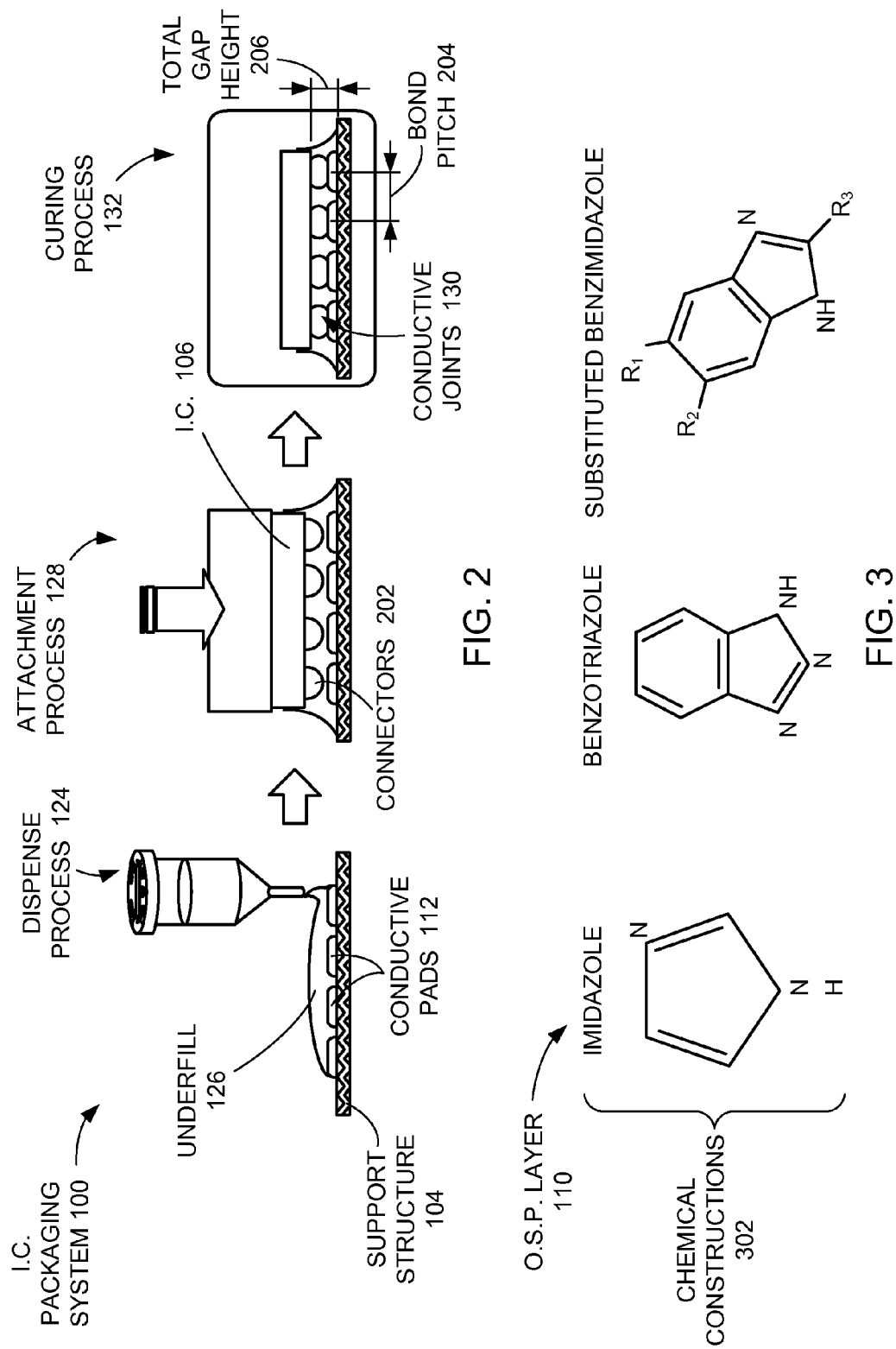

| LEG | PLASMA CONDITION | | | | | BONDING CONDITION | | ATTACHMENT FORCE 136 | | |
|---|---|---|---|---|---|---|---|---|---|---|
| | POWER | GAS 1 | | GAS 2 | | PLASMA TIME (SEC) | BONDING FORCE | S/S | QUALITY CHECK | |
| | | TYPE | FLO RAT | TYPE | FLO RAT | | | | OS | SAT |
| 1 | 600 | AR | 40 | | | 60 | 60 | | 5/5 | 0/5 |
| 2 | | | | | | | 70 | | 5/5 | 0/5 |
| 3 | | | | | | | 80 | 5 EA | 5/5 | 0/5 |
| 4 | | | | | | | 90 | 5 EA | 5/5 | 0/5 |
| 5 | | | | | | | 110(POR) | 5 EA 1 STRIP (UMTC) | *2/5 | 0/5 |
| 6 | 600 | HE | 40 | | | 60 | 60 | 5 EA | 5/5 | 0/5 |
| 7 | | | | | | | 70 | 5 EA | 5/5 | 0/5 |
| 8 | | | | | | | 80 | 5 EA 1 STRIP (SEMCO) | 3/5 | 0/5 |
| 9 | | | | | | | 90 | 5 EA | 3/5 | 0/5 |
| 10 | | | | | | | 110(POR) | | 0/5 | 0/5 |
| 11 | 300 | O₂ | 40 | H₂ | 40 | 30+30 | 60 | 5 EA | 5/5 | 0/5 |
| 12 | | | | | | | 70 | 5 EA | 5/5 | 0/5 |
| 13 | | | | | | | 80 | 5 EA 1 STRIP (SEMCO) | 3/5 | 0/5 |
| 14 | | | | | | | 90 | 5 EA | 0/5 | 0/5 |
| 15 | | | | | | | 110(POR) | 5 EA | 0/5 | 0/5 |

1ST STEP 116 · 2ND STEP 120 · DIOXYGEN 118 · DIHYDROGEN 122

FIG. 9

| LEG | PLASMA CONDITION | | | | | BONDING CONDITION | | QUALITY CHECK | | |
|---|---|---|---|---|---|---|---|---|---|---|
| | POWER | GAS 1 | | GAS 2 | | PLASMA TIME(SEC) | BONDING FORCE | S/S | OS REJECT | | SAT (NCP VOID) |
| | | TYPE | FLO RAT | TYPE | FLO RAT | | | | | RATIO | |
| 1 | 300 | $O_2$ | 40 | $H_2$ | 40 | 30+30 | 70 | 5 EA | 5/5 | 100% | 0/5 |
| 2 | | | | | | | 80 | 57 EA | 23/57 | 40% | 0/57 |
| 3 | | | | | | | 90 | 55 EA | 14/55 | 25% | 0/55 |
| 4 | | | | | | | 100 | 5 EA | 4/5 | 80% | 0/5 |
| 5 | | | | | | | 110(POR) | 5 EA | 2/5 | 40% | 0/5 |

ATTACHMENT FORCE 136

DIHYDROGEN 122

DIOXYGEN 118

| LEG | FIRST PLASMA | | | SECOND PLASMA | | | PROTECTION LAYER THICKNESSES 1102 | |
|---|---|---|---|---|---|---|---|---|
| | GAS | RF POWER (W) | TIME(SEC) | GAS | RF POWER (W) | TIME(SEC) | OSP THICKNESS | REMOVAL |
| REF | | NO PLASMA | | | | | 0.1844 | 0 |
| 1 | O2 | 100 | 10 | H2 | 100 | 10 | 0.1826 | 0.0018 |
| 2 | O2 | 100 | 30 | H2 | 100 | 30 | 0.1866 | -0.0022 |
| 3 | O2 | 100 | 60 | H2 | 100 | 60 | 0.1828 | 0.0016 |
| *4 | O2 | 100 | 90 | H2 | 100 | 90 | 0.1632 | 0.0212 |
| 5 | O2 | 300 | 10 | H2 | 300 | 10 | 0.1832 | 0.0012 |
| 6 | O2 | 300 | 30 | H2 | 300 | 30 | 0.1682 | 0.0162 |
| *7 | O2 | 300 | 60 | H2 | 300 | 60 | 0.1614 | 0.0230 |
| *8 | O2 | 300 | 90 | H2 | 300 | 90 | 0.1602 | 0.0242 |
| 9 | O2 | 600 | 10 | H2 | 600 | 10 | 0.1818 | 0.0026 |
| 10 | O2 | 600 | 30 | H2 | 600 | 30 | 0.1634 | 0.0210 |
| 11 | O2 | 600 | 60 | H2 | 600 | 60 | 0.168 | 0.0164 |
| 12 | O2 | 600 | 90 | H2 | 600 | 90 | 0.175 | 0.0094 |
| 13 | O2 | 100 | 10 | NONE | | | 0.1888 | -0.0044 |
| 14 | O2 | 100 | 90 | NONE | | | 0.1754 | 0.0090 |
| 15 | O2 | 600 | 10 | NONE | | | 0.1813 | 0.0031 |
| *16 | O2 | 600 | 90 | NONE | | | 0.15 | 0.0344 |

| LEG # | NCP | PRE-CLEAN | PLASMA STEP-1 GAS | STEP-1 POW | STEP-1 TIME | STEP-2 GAS | STEP-2 POW | STEP-2 TIME | BOND FORCE(N) | S/S | C-SAM | OS | X-SEC |
|---|---|---|---|---|---|---|---|---|---|---|---|---|---|
| CON-1 | 5208 | - | AR | 550W | 20S | | - | | 110 | 1 SEGMENT | ALL | ALL | 1 EA |
| CON-2 | | | | | | | | | 110 | 1 SEGMENT | ALL | ALL | 1 EA |
| CON-2-1 | 5209-1 | WF6070SP | AR | 300W | 20S | | - | | 100 | 1 SEGMENT | ALL | ALL | 1 EA |
| CON-2-2 | | | | | | | | | 90 | 1 SEGMENT | ALL | ALL | 1 EA |
| CON-2-3 | | | | | | | | | 80 | 1 SEGMENT | ALL | ALL | 1 EA |
| 1 | | | O2 | | | | | | 70 | 1 SEGMENT | ALL | ALL | 1 EA |
| 1-1 | 5201 | - | O2 | 100W | 90S | | 100W | 90S | 110 | 1 SEGMENT | ALL | ALL | 1 EA |
| 1-2 | | | | | | | | | 100 | 1 SEGMENT | ALL | ALL | 1 EA |
| 1-3 | | | | | | | | | 90 | 1 SEGMENT | ALL | ALL | 1 EA |
| 1-4 | | | | | | | | | 80 | 1 SEGMENT | ALL | ALL | 1 EA |
| 2 | | | O2 | | | H2 | | | 70 | 1 SEGMENT | ALL | ALL | 1 EA |
| 2-1 | 5201 | - | O2 | 300W | 60S | H2 | 300W | 60S | 110 | 1 SEGMENT | ALL | ALL | 1 EA |
| 2-2 | | | | | | | | | 100 | 1 SEGMENT | ALL | ALL | 1 EA |
| 2-3 | | | | | | | | | 90 | 1 SEGMENT | ALL | ALL | 1 EA |
| 2-4 | | | | | | | | | 80 | 1 SEGMENT | ALL | ALL | 1 EA |
| 3 | | | O2 | | | | | | 70 | 1 SEGMENT | ALL | ALL | 1 EA |
| 3-1 | 5201 | - | O2 | 300W | 90S | | 300W | 90S | 110 | 1 SEGMENT | ALL | ALL | 1 EA |
| 3-2 | | | | | | | | | 100 | 1 SEGMENT | ALL | ALL | 1 EA |
| 3-3 | | | | | | | | | 90 | 1 SEGMENT | ALL | ALL | 1 EA |
| 3-4 | | | | | | | | | 80 | 1 SEGMENT | ALL | ALL | 1 EA |
| 4 | | | O2 | | | | | | 70 | 1 SEGMENT | ALL | ALL | 1 EA |
| 4-1 | 5201 | - | O2 | 600W | 90S | | - | | 110 | 1 SEGMENT | ALL | ALL | 1 EA |
| 4-2 | | | | | | | | | 100 | 1 SEGMENT | ALL | ALL | 1 EA |
| 4-3 | | | | | | | | | 90 | 1 SEGMENT | ALL | ALL | 1 EA |
| 4-4 | | | | | | | | | 80 | 1 SEGMENT | ALL | ALL | 1 EA |
|  |  |  |  |  |  |  |  |  | 70 | 1 SEGMENT | ALL | ALL | 1 EA |

FIG. 13

| LEG # | NCP | PRE-CLEAN | PLASMA ||||| S/S (EA) || REMARK |
|---|---|---|---|---|---|---|---|---|---|
| | | | STEP-1 ||| STEP-2 ||| | |
| | | | GAS | POW | TIME | GAS | POW | TIME | REL | EOL QUALITY CHECK | |
| CON-1 | 5208 | - | AR | 550W | 20S | - | - | - | 150 | 135 | 15 | PREVIOUS POR |
| CON-2 | 5209-1 | WF6070SP | AR | 300W | 20S | - | - | - | 150 | 135 | 15 | CURRENT POR |
| 1 | 5201 | - | O2 | 100W | 90S | H2 | 100W | 90S | 150 | 135 | 15 | PLASMA CONDITION-1 |
| 2 | 5201 | - | O2 | 300W | 60S | H2 | 300W | 60S | 150 | 135 | 15 | PLASMA CONDITION-2 |
| 3 | 5201 | - | O2 | 300W | 90S | H2 | 300W | 90S | 150 | 135 | 15 | PLASMA CONDITION-3 |
| 4 | 5201 | - | O2 | 600W | 90S | - | - | - | 150 | 135 | 15 | PLASMA CONDITION-4 |

FIG. 14

| LEG# | MSL3 | MSL3+TCB (500,1000) | HTS (500,1000) | MSL3+UHAST (96,192HRS) | TOTAL Q'TY | R/O QUALITY CHECK ITEM |
|---|---|---|---|---|---|---|
| CON-1 | 90EA | 45EA | 45EA | 45EA | 135EA | O/S AND SAT INSPECTION |
| CON-2 | 90EA | 45EA | 45EA | 45EA | 135EA | |
| 1 | 90EA | 45EA | 45EA | 45EA | 135EA | |
| 2 | 90EA | 45EA | 45EA | 45EA | 135EA | |
| 3 | 90EA | 45EA | 45EA | 45EA | 135EA | |
| 4 | 90EA | 45EA | 45EA | 45EA | 135EA | |

METHOD OF MANUFACTURE OF INTEGRATED CIRCUIT PACKAGING SYSTEM WITH PLASMA PROCESSING

TECHNICAL FIELD

The present invention relates generally to a method of manufacture of an integrated circuit packaging system, and more particularly to an integrated circuit packaging system with plasma processing.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for a method of manufacture of an integrated circuit packaging system providing integration, space savings, and low cost manufacturing. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system that includes heating a support structure having a conductive pad and an organic surface protection layer on the conductive pad; removing the organic surface protection layer from the conductive pad by a plasma process with a two-step method, the two-step method includes a first step with a dioxygen and a second step with a dihydrogen, wherein the second step immediately follows the first step; and forming an underfill over the conductive pad.

Certain embodiments of the invention have other steps or elements in addition to or in place of those mentioned above. The steps or the elements will become apparent to those skilled in the art from a reading of the following detailed description when taken with reference to the accompanying drawings.

BRIEF DESCRIPTION OF THE DRAWINGS

FIG. 2 is a portion of the process flow of the integrated circuit packaging system.

FIG. 3 is an example of chemical constructions of the organic surface protection layer.

FIG. 9 is a table of a first trial test result of a feasibility test.

FIG. 10 is a table of a second trial test result of the feasibility test.

FIG. 11 is a table of an evaluation matrix.

FIG. 13 is a table of a bond force evaluation matrix.

FIG. 14 is a table of a build matrix for reliability (REL) assessment.

FIG. 15 is a table of reliability sample sizes.

BEST MODE FOR CARRYING OUT THE INVENTION

Figure 1:
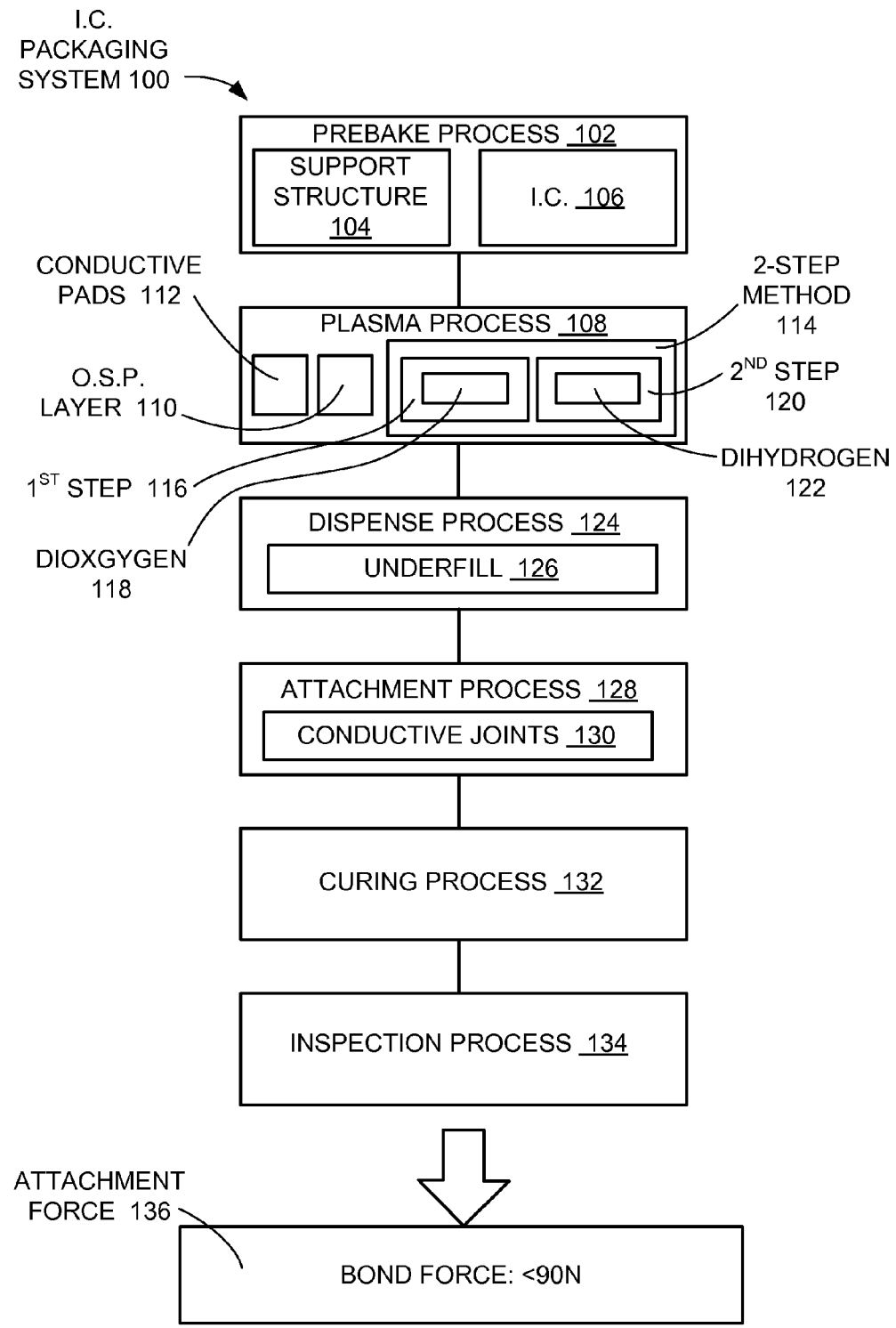
FIG. 1 is a process flow of a method of manufacture of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to a plane of a surface of a support structure, which will subsequently be described as a substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct physical contact between one element and another element without an intervening element.

The term "processing" as used herein includes deposition of material or photoresist, patterning, exposure, development, etching, cleaning, and/or removal of the material or photoresist as required in forming a described structure.

Referring now to FIG. 1, therein is shown a process flow of a method of manufacture of an integrated circuit packaging system 100 in an embodiment of the present invention. The integrated circuit packaging system 100 includes a prebake process 102 to heat a support structure 104, including a substrate or a printed circuit board (PCB), in preparation for subsequent processing steps.

The support structure 104 provides mounting and connecting an integrated circuit 106. For example, the support structure 104 can be a ceramic substrate or any other subsystems that provide support and electrical connections for the integrated circuit 106.

The integrated circuit packaging system 100 includes a plasma process 108 to remove an organic surface protection layer 110 on the support structure 104. The organic surface protection layer 110 can be selectively applied to conductive pads 112 of the support structure 104. The organic surface protection layer 110 is removed so that the conductive pads 112 are ready for bonding including soldering. The organic surface protection layer 110 is an insulation layer including an organic solderability preservative (OSP) layer.

For example, the plasma process 108 represents an enhanced plasma process for the integrated circuit packaging system 100 with copper on organic solderability preservative (CuOSP) surface pad finish in thermal compression (TC) bonding. The present invention relates to the enhanced plasma process to improve yield and to reduce machine utilization cost in a thermal compression process.

The plasma process 108 employs a two-step method 114. The two-step method 114 includes a first step 116 that uses only a single gas of a dioxygen 118 ($O_2$) and a second step 120 that uses only a single gas of a dihydrogen 122 ($H_2$), where the second step 120 immediately follows the first step 116. The term "immediately follow" refers to two manufacture-processing steps that are performed without any other intervening manufacturing steps in between.

Two oxygen atoms are bind to form the dioxygen 118, which is a diatomic gas that is colorless, odorless, and tasteless, with the formula $O_2$. At standard temperature and pressure, hydrogen is a colorless, odorless, tasteless, non-toxic, nonmetallic, highly combustible diatomic gas with the molecular or chemical formula $H_2$, the dihydrogen 122, which contains two hydrogen atoms.

The integrated circuit packaging system 100 includes a dispense process 124 to form an underfill 126 over or directly on the conductive pads 112 of the support structure 104. The underfill 126 includes an insulation layer including a non-conductive paste (NCP). The underfill 126 provides an adhesive that acts as a flux to remove oxide from metal contacts.

The integrated circuit packaging system 100 includes an attachment process 128 to mount the integrated circuit 106 over the support structure 104. The attachment process 128 forms conductive joints 130 as reliable connections between the integrated circuit 106 and the conductive pads 112 of the support structure 104 with the underfill 126 in between the integrated circuit 106 and the support structure 104. The attachment process 128 includes a thermal compression bonding method.

The integrated circuit packaging system 100 includes a curing process 132 to harden the conductive joints 130 between the integrated circuit 106 and the support structure 104, where the connections have been formed in the attachment process 128. The curing process 132 includes a hardening method including a post non-conductive paste curing method. The curing process 132 can include a heating process and a subsequent cooling process for the hardening method.

The integrated circuit packaging system 100 includes an inspection process 134 to determine the quality of at least the connections between the integrated circuit 106 and the support structure 104. For example, the inspection process 134 can be referred to as a third ($3^{rd}$) inspection step in a manufacturing flow.

The process flow will be compared to that of a current plan of record (POR) or existing process. The current POR process includes a pre-cleaning process to remove an OSP layer. The pre-cleaning process includes Argon (Ar) plasma, but the process flow described in the embodiments of the present invention therein includes the dioxygen 118 ($O_2$) and the dihydrogen 122 in the plasma process 108.

If the enhanced plasma process or the plasma process 108 is applied, then a short and robust process flow is achieved. Therefore, the embodiments provide a cost reduction process.

The current POR process includes the pre-cleaning process including Ar plasma, flux dispense, reflow, and flux cleaning. The current POR process is followed by a conventional thermal compression bonding with non-conductive paste (TC-NCP) flow.

However, the embodiments include only plasma $O_2$ or the dioxygen 118 and $H_2$ or the dihydrogen 122 instead of the pre-cleaning that includes Ar plasma. The conventional TCNCP flow uses a bond force greater than 110 newton (N), which is high and causes joint slips, but the embodiments in the present invention uses a bond force or an attachment force 136 less than or equal to 90 N in the attachment process 128.

Thus, the embodiments in the present invention greatly reduce the bond force in the TCNCP process with the enhanced plasma process. The embodiments also employ unique gas materials, such as the dioxygen 118 ($O_2$) and the dihydrogen 122, and a process step in the enhanced plasma process for CuOSP pad finish.

The plasma process 108 employing the dioxygen 118 ($O_2$) and the dihydrogen 122 provides several advantages. One advantage is yield improvement with good solder joint quality using a low bond force or the attachment force 136 less than 90 N to improve alignment and wetting performance. Another advantage is an ability to employ a TCNCP process by changing a source gas from Ar to the dioxygen 118 ($O_2$) and the dihydrogen 122 in the two-step method 114.

A further advantage is low equipment utilization cost and short conversion time with the attachment force 136. The attachment force 136 is advantageous over a high bond force application because of improved reliability since the high bond force application causes joint slips resulting in unreliable connections. Thus, the high bond force application needs to change its higher bond force capability.

A yet further advantage is a cost effective process with a short process flow. The enhanced plasma process or the plasma process 108 is employed that is shorter and more cost effective than the conventional TCNCP flow.

It has been discovered that the enhanced plasma process using the 2-step process using dioxygen ($O_2$) and dihydrogen ($H_2$) provides improved yield and machine utilization cost reduction in the thermal compression process.

Referring now to FIG. 2, therein is shown a portion of the process flow of the integrated circuit packaging system 100. The portion can include a TCNCP process flow in a flip chip configuration. The TCNCP process flow includes a thermal compression bonding (TCB) with a non-conductive paste (NCP).

FIG. 2 depicts the dispense process 124, the attachment process 128, and the curing process 132. The TCNCP process flow is different when compared to a conventional flip chip process, which includes flux dispensing, mounting, reflowing, flux cleaning, insulation dispensing, and curing (or post cure).

The dispense process 124 forms the underfill 126 over the conductive pads 112 of the support structure 104. The attachment process 128 forms the conductive joints 130 between the integrated circuit 106 and the support structure 104 with the underfill 126 in between. The conductive joints 130 provide reliable electrical connections between and directly on connectors 202 of the integrated circuit 106 and the conductive pads 112. The curing process 132 hardens the conductive joints 130. The connectors 202 include a conductive material including copper (Cu) or any other metal or alloy.

The portion of the process flow of the integrated circuit packaging system 100 provides several advantages. One advantage provides a fine pitch application with a bond pitch 204 below 40 micrometers (um) or 80 um.

The bond pitch 204 is a distance between immediately adjacent connections. For example, the bond pitch 204 can be a distance between two of the connectors 202, two of the conductive pads 112, or two of the conductive joints 130 that are immediately next to each other without any intervening connections.

Another advantage is an enhancement of filling a fine gap height or a total gap height 206 below 50 um. The total gap height 206 will subsequently be described. A further advantage is a lower stress process compared to a conventional flip chip process. The lower stress process is available for advanced silicon (Si) node application below 20 N. A yet further advantage is a flux-less process since there is no risk for flux residue.

Referring now to FIG. 3, therein is shown an example of chemical constructions 302 of the organic surface protection layer 110. The example includes a number of the chemical constructions 302. For example, the chemical constructions 302 can be of an OSP material.

On the left side of FIG. 3, one of the chemical constructions 302 includes Imidazole, which is an organic compound with a formula of $(CH)_2N(NH)CH$. Imidazole is a colourless solid and a mildly alkaline solution. Imidazole is a common family of heterocycles sharing the 1,3-C3N2 ring. Imidazole is a highly polar compound. Imidazole is highly soluble and aromatic due to the presence of a sextet of pi-electrons.

In the middle of FIG. 3, another of the chemical constructions 302 includes Benzotriazole, which is an organic compound with a formula of $C_6H_5N_3$. Benzotriazole is a colourless solid and a polar compound. Benzotriazole is fairly water-soluble.

On the right side of FIG. 3, yet another of the chemical constructions 302 includes a substituted benzimidazole. The substituted benzimidazole can include proprietary substitution groups, denoted as "R", with confidential properties applied.

For example, the OSP material can be least expensive and simplest. Also for example, the OSP material can have poor contact functionality.

It has been discovered that the embodiments of the present invention provide improved reliability because the plasma process 108 of FIG. 1 reliably removes the organic surface protection layer 110 from the conductive pads 112 of FIG. 1 of the support structure 104 of FIG. 1 for subsequent bonding operations since the organic surface protection layer 110 has the poor contact functionality that prevents the attachment process 128 of FIG. 1 from forming the conductive joints 130 of FIG. 1 as the reliable connections.

Figure 4:
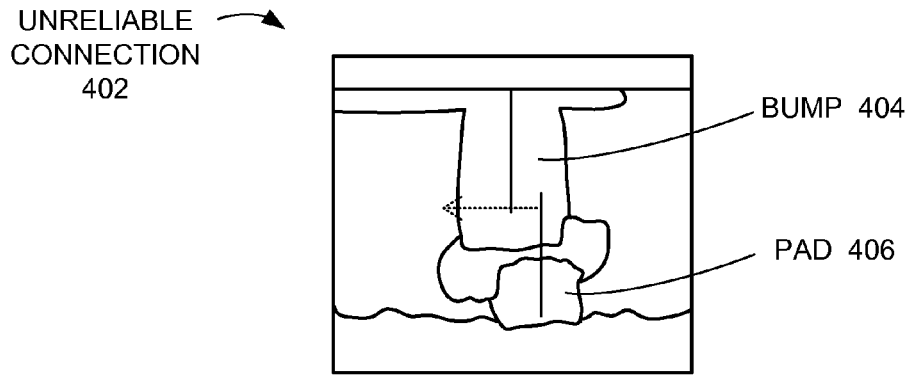
FIG. 4 is an example of a cross-section of an unreliable connection.

Referring now to FIG. 4, therein is shown an example of a cross-section of an unreliable connection 402. The cross-section depicts a problem with the unreliable connection 402 due to a limitation of a CuOSP pad surface finish in an existing TCNCP technique. The problem is due to not enough solder wettability between a bump 404 and a pad 406 without flux function. A flux function is included not until a manufacturing process approaches an application of an NCP material.

For example, the pad 406 can include the CuOSP pad finish. Also for example, the bump 404 and the pad 406 can represent solder and a Cu back-of-line (BOL) pad. In the example, the CuOSP finish needs a higher bonding force than other surface finish materials. As such, a joint slip phenomenon occurs due to the higher bond force in CuOSP.

The example includes optimize parameters of the higher bonding force of 110 N, a contact temperature of 125 degrees Celsius, and a contact time of 1.3 seconds (sec). The optimize parameters also include a peak temperature of 245 degrees Celsius, a dwell time of 1.6 sec, and an NCP volume of 7 milligrams (mg).

Figure 5:
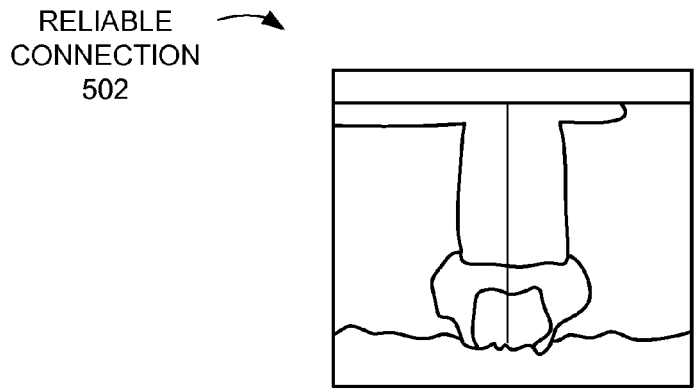
FIG. 5 is an example of a cross-section of a reliable connection.

Referring now to FIG. 5, therein is shown an example of a cross-section of a reliable connection 502. The cross-section depicts a good joint that is reliable due to a lower bonding force. In the example, a surface finish material can include Electroless Nickel-Electroless Palladium-Immersion Gold (ENEPIG). ENEPIG needs the lower bonding force of 70 N, but CuOSP needs over 110 N.

The example includes optimize parameters of the lower bonding force of 110 N, a contact temperature of 125 degrees Celsius, and a contact time of 1.3 seconds (sec). The optimize parameters also include a peak temperature of 245 degrees Celsius, a dwell time of 1.6 sec, and an NCP volume of 7 milligrams (mg).

Figure 6:
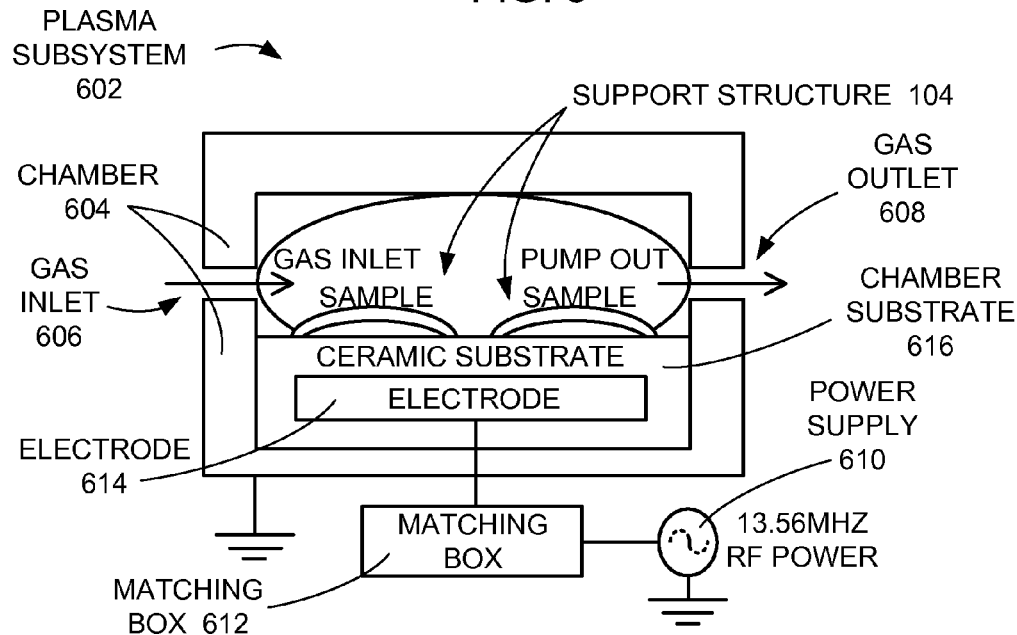
FIG. 6 is a block diagram of a plasma sub-system in the integrated circuit packaging system of FIG. 1.

Referring now to FIG. 6, therein is shown a block diagram of a plasma sub-system 602 in the integrated circuit packaging system 100 of FIG. 1. FIG. 6 shows a schematic of the plasma sub-system 602.

The plasma sub-system 602 employs the plasma process 108 of FIG. 1. The plasma sub-system 602 includes a chamber 604 for holding the support structure 104, which can be placed in the chamber 604 at locations labeled by "sample" in FIG. 6.

In the two-step method 114 of FIG. 1, the dioxygen 118 of FIG. 1 and the dihydrogen 122 of FIG. 1 are pumped into and out of the chamber 604. The chamber 604 allows the dioxygen 118 and the dihydrogen 122 to enter the chamber 604 through a gas inlet 606 and exit the chamber 604 through a gas outlet 608.

The plasma sub-system 602 includes a power supply 610 for providing a source to a matching box 612 connected to an electrode 614 of a chamber substrate 616. The power supply 610 provides power to the plasma sub-system 602 for performing the plasma process 108. For example, the power supply 610 can include radio frequency (RF) at a frequency of approximately 13.56 megahertz (MHz).

Figure 7:
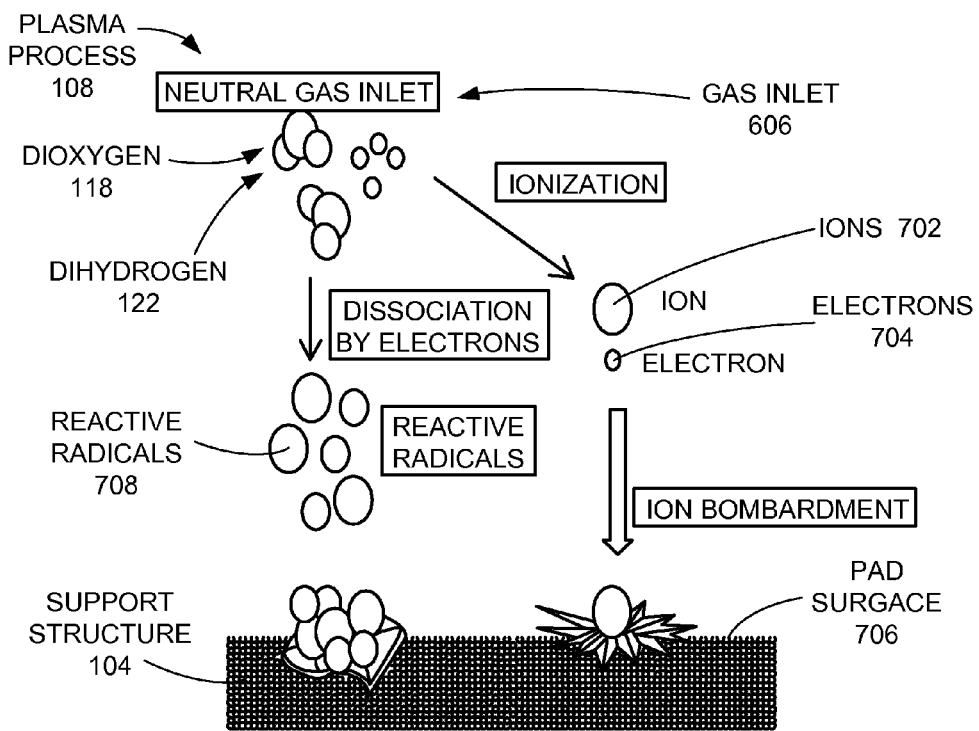
FIG. 7 is a diagram of dissociative ionization in the plasma process.

Referring now to FIG. 7, therein is shown a diagram of dissociative ionization in the plasma process 108. The plasma process 108 begins with the dioxygen 118 and the dihydrogen 122 as neutral gases entering the gas inlet 606. Each of the dioxygen 118 and the dihydrogen 122 becomes plasma when it is heated in the chamber 604 of FIG. 6 until ions 702 of the dioxygen 118 and the dihydrogen 122 lose their electrons 704, leaving a highly electrified collection of nuclei and free electrons.

When a pad surface 706 of the conductive pads 112 of FIG. 1 of the support structure 104 is bombarded by the ions 702, material is removed at the conductive pads 112. Atoms of the dioxygen 118 and the dihydrogen 122 create reactive radicals 708 by electron impact dissociation, providing directed energy towards the pad surface 706 to assist surface reactions.

Typically, an etching rate of oxygen plasma is higher than argon plasma for etching an organic material or the organic surface protection layer 110 of FIG. 1. At argon plasma, an ion bombardment that energy of ion acceleration depends on a bias voltage is the prior effect on the surface modification or etching. If the support structure 104 has warpage, the bias voltage at a plasma reactor is not uniform. Thus, the ion bombardment energy is not uniform over the support structure 104.

However, in radical based plasma, such as the oxygen plasma, the mechanism of etching is the chemical reaction between an organic surface and the reactive radicals 708. These radicals are not affected by electrode bias voltage.

Figure 8:
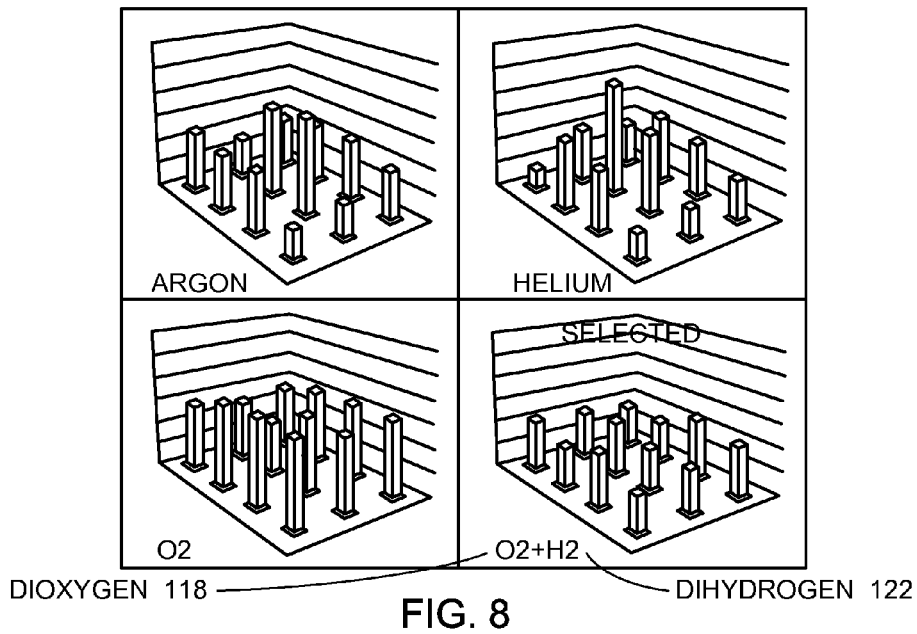
FIG. 8 is a diagram of gas selection for the plasma process of FIG. 1.

Referring now to FIG. 8, therein is shown a diagram of gas selection for the plasma process 108 of FIG. 1. FIG. 8 depicts a number of gases including Argon (Ar), Helium (He), the dioxygen 118 ($O_2$), and the dihydrogen 122 ($H_2$). The gas selection among these gases has been performed for the plasma process 108.

There are initial evaluation results for plasma source gas and from the results, it has been determined that $O_2+H_2$ plasma provides higher CuOSP removal rate with good uniformity compared to other gases, including Ar, He, and $O_2$, when the other gases are used either singly or as a mixture in a plasma step. As such, the two-step method 114 of FIG. 1 using the first step 116 of FIG. 1 that uses only a single gas of the dioxygen 118 ($O_2$) and the second step 120 that uses only a single gas of the dihydrogen 122 ($H_2$) has been found to provide improved reliability.

Referring now to FIG. 9, therein is shown a table of a first trial test result of a feasibility test. The feasibility test is conducted for a CuOSP removal by the plasma process 108 of FIG. 1. The first trial test result shows that the plasma process 108 using the dioxygen 118 ($O_2$) and the dihydrogen 122 ($H_2$) is effective.

Regarding leg 5, the table depicts 2 of 5 samples failed due to open/short (O/S) rejects is not related to a TCNCP process but the failure mode is a misalignment due to a machine problem. This results in 0 of 3 samples of failure in this first trial test. However, leg 5 used a bonding force of 110 N, which is much higher than the attachment force 136 of less than or equal to 90 N used in the embodiments and thus is be prone to having the unreliable connection 402 of FIG. 4 in production.

The feasibility test shows a good O/S result with a lower bonding force for 2 of 5 samples passed, while Ar is not working with the same bond force as shown in legs 3-4. In addition, the first trial test result is confirmed with a large sample size in a 2nd trial. However, there is some noise in legs 4-5 in the 2nd trial, and thus, an $O_2/H_2$ parameter optimization design of experiment (DOE) has been conducted and described in FIG. 11 below. Legs 1-15 show that SAT is ALL.

The POR plasma source is Ar with 600 watts (W) of power. It is expected that plasma efficiency of $O_2$ and $H_2$ is better than Ar, resulting in a decrease in power for legs 11-15. There is no data but it is expected that Ar and He have a higher number of the O/S rejects at 300 W compared to 600 W.

The POR condition achieves full reliability (REL) assessment, using actual test vehicle and conditions from customer program. "POR" refers to Plan of Record or a current base condition. For example, POR can include a best known method. Good O/S means all of the connectors 202 of FIG. 2 are interconnected with the conductive pads 112 of FIG. 1, and thus electrically good connections. In this case, a lower reject ratio of the O/S rejects is better.

A value of "0" in the number of O/S rejects means no void and SAT inspection means NCP void check. This is one of the important qualities in a TCNCP process. Different plasma sources and conditions can affect NCP flow-ability and interface conditions. That is why NCP void is checked as well with SAT.

In FIG. 9, the unit of flow rate is Standard Cubic Centimeter per Minutes ($cm^3$/min) or "sccm". Also in FIG. 9, S/S refers to "sample size" and SAT refers to Scanning Acoustic Transmitted Wave, which is one of detection methods of determining defects including NCP voids in a package (PKG).

Each leg refers to a trial number or a number of an evaluation. A strip refers to a substrate in a semiconductor package including a Flip Chip Chip Scale Package (fcCSP) PKG. The term "ea" refers to a quantity of units. A strip is a structure with a number of segments, each of which includes a number of units.

For example, the strip refers to a structure have 4 segments, each of which has 9 units ("ea"), where each of the units is the support structure 104 of FIG. 1. In this example, there can be 36 units ("ea") per strip.

It has been unexpectedly found that the plasma process 108 having the two-step method 114 of FIG. 1 with the first step 116 that uses only a single gas of the dioxygen 118 ($O_2$) and the second step 120 that uses only a single gas of the dihydrogen 122 ($H_2$) provided improved reliability. The improved reliability is provided because the plasma process 108 shows good (O/S) result with a lower bonding force than a force used in a condition of the current plan of record (POR) or existing process. The good open/short (O/S) result is evident by a lower number of O/S rejects when the attachment force 136 of less than or equal to 90 N is used.

Referring now to FIG. 10, therein is shown a table of a second trial test result of the feasibility test. The feasibility test is conducted for the CuOSP removal by the plasma process 108 of FIG. 1. The plasma process 108 using the dioxygen 118 ($O_2$) and the dihydrogen 122 ($H_2$) effective from the first trial test result is applied in a second trial test. The second trial test result shows an effective result the same as the first trial test with the attachment force 136 as a lower bonding force using the plasma with the dioxygen 118 ($O_2$) and the dihydrogen 122 ($H_2$).

Referring now to FIG. 11, therein is shown a table of an evaluation matrix. The table depicts a test plan for the CuOSP removal for an evaluation of an $O_2/H_2$ plasma, which includes the dioxygen 118 ($O_2$) and the dihydrogen 122 ($H_2$) in the two-step method 114 of FIG. 1.

A purpose of the test plan is to establish an optimum $O_2/H_2$ plasma condition to remove the organic surface protection layer 110 of FIG. 1 and to investigate a TCNCP process condition by an effectiveness of the $O_2/H_2$ plasma and its REL performance. The evaluation matrix shows a plasma parameter optimization of the $O_2/H_2$ plasma, where the plasma parameter optimization is a selected condition from a measurement of protection layer thicknesses 1102, denoted as OSP thickness, of the organic surface protection layer 110. The protection layer thicknesses 1102 are measured after a portion of the organic surface protection layer 110 has been removed.

In FIG. 11, legs 4, 7-8, and 16 are selected to determine the optimized condition based on an OSP thickness. These legs have lower OSP thicknesses compared to that of a reference measurement with a no plasma condition. In other words, these legs show higher removal rates of an OSP layer from measurement results.

Figure 12:
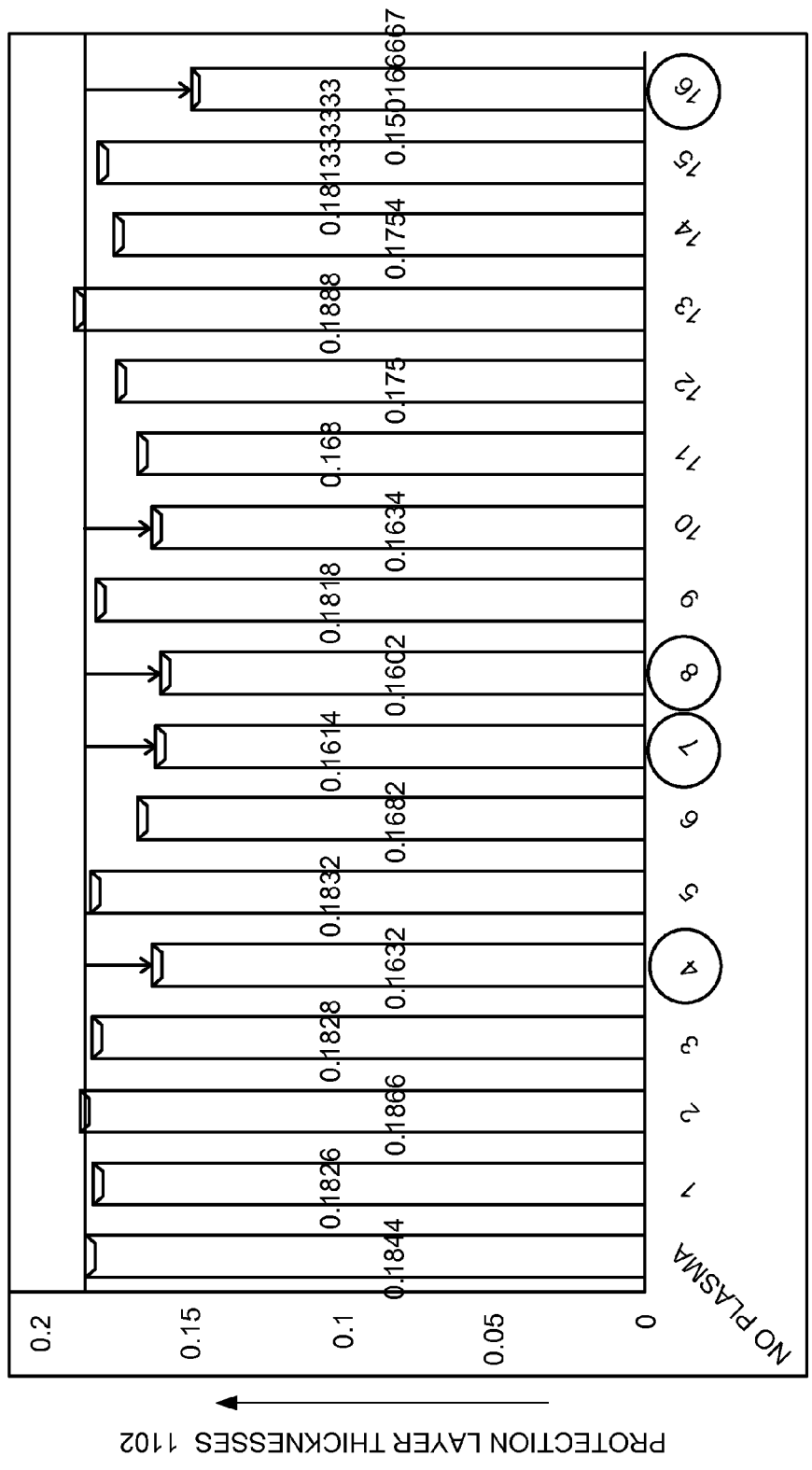
FIG. 12 is a graph of the measurement of the protection layer thicknesses.

Referring now to FIG. 12, therein is shown a graph of the measurement of the protection layer thicknesses 1102. The graph depicts average values of the protection layer thicknesses 1102 after the $O_2/H_2$ plasma is applied.

Referring now to FIG. 13, therein is shown a table of a bond force evaluation matrix. FIG. 13 depicts Quality Check data for C-mode scanning acoustic microscope (C-SAM) for NCP voids, electrical open/short (O/S) tests, and X-Section for solder joint quality. Legs that are shown in FIG. 13 with "Con-" refer to "control" conditions, which are current POR conditions.

The table in FIG. 13 confirms a new plasma condition discovered by the plasma process 108 of FIG. 1. The new plasma condition is working with a low bond force condition using the attachment force 136 of FIG. 1 from a bond force design of experiment (DOE) and confirmed with quality check items in the Quality Check data above.

Referring now to FIG. 14, therein is shown a table of a build matrix for reliability (REL) assessment. FIG. 14 depicts REL performance check through an REL assessment using the plasma process 108 of FIG. 1.

Referring now to FIG. 15, therein is shown a table of reliability sample sizes. FIG. 15 depicts sample sizes including 45 units (ea), from a Joint Electron Device Engineering Council (JEDEC) standard. If there is no failure from the REL assessment, it is guaranteed that 90% of confidence level is achieved with the Lot Tolerance Percent Defective 5. A sample size of 45 units (ea) is specified in Table A under the Pass/Fail Criteria section of the general requirements of the JEDEC standard.

Stress tests including Moisture Sensitive Level 3 (MSL3), High Temperature Storage (HTS), Unbiased Temperature/Humidity (uHAST), and Temperature Cycling (TC) are qualification tests for components in non-hermetic packages, based on the JEDEC standard. "R/O" refers to a read out point at, for example, 500 cycles and 1000 cycles in TC 'B' condition (e.g., −55° C. to +125° C.), and 500 hours and 1000 hours in HTS. In this example, the cycles and the hours stand for or refer to lifetime of devices from acceleration tests.

Preconditioning of the MSL stress test can be performed prior to, for example, Temperature Humidity bias (TBH), Temperature Humidity bias (HAST), TC, Unbiased Temperature/Humidity (AC), and uHAST. The HTS stress test includes 150° C. and preconditioning. The uHAST stress test includes conditions of 130° C./85% RH, and 110° C./85% RH. The conditions previously described are specified in Table 2 of the Qualification Tests for Components in Non-Hermetic Packages of the JEDEC standard. An OSP thickness measurement system employed by the embodiments includes various test vehicles to determine the reliability of the plasma process 108 of FIG. 1.

Figure 16:
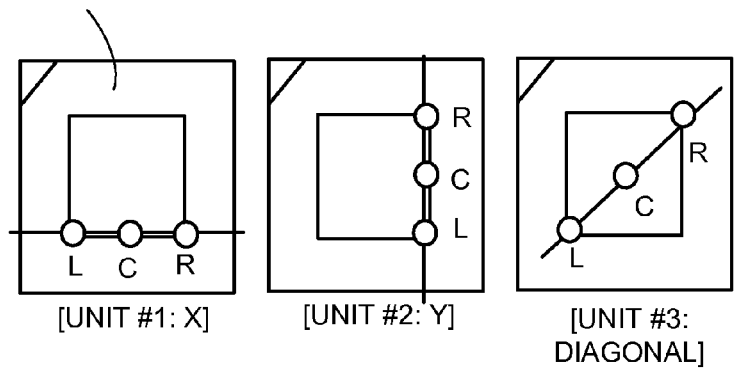
FIG. 16 is a diagram illustrating measurement configurations of the support structure.

Referring now to FIG. 16, therein is shown a diagram illustrating measurement configurations of the support structure 104. The diagram depicts measurements previously described at a number of locations on the support structure 104. The locations are denoted as left (L), center (C), and right (R) in each direction in FIG. 16. The measurements can include, for example, a sample size of 3 units (ea)/leg.

Figure 17:
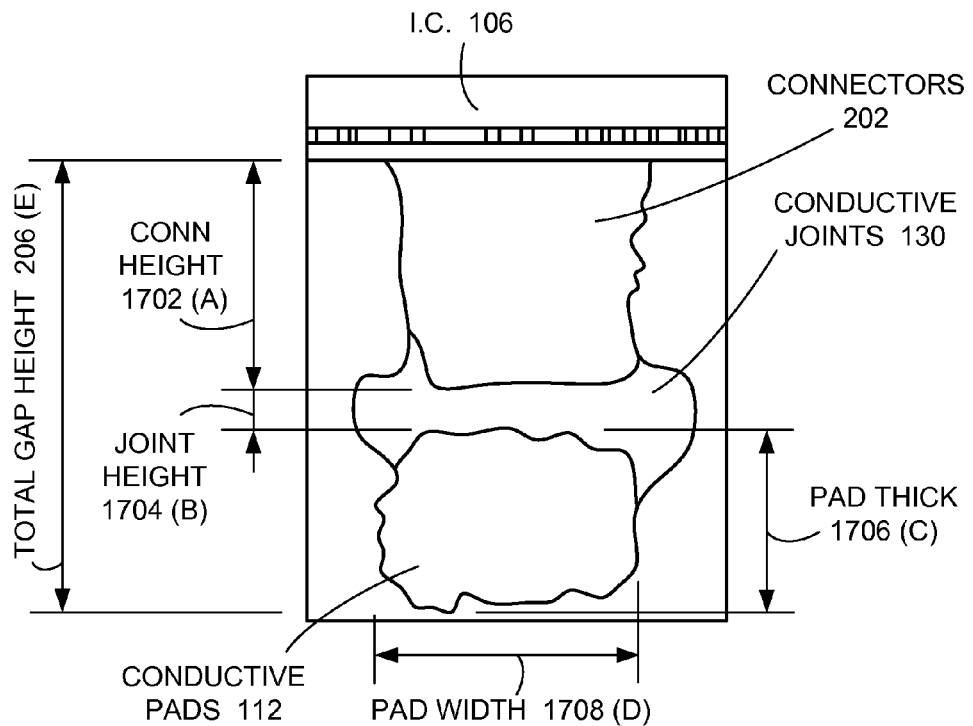
FIG. 17 is a cross-sectional view of one of the conductive joints.

Referring now to FIG. 17, therein is shown a cross-sectional view of one of the conductive joints 130. Each of the connectors 202 of the integrated circuit 106 includes a connector height 1702, denoted as A. The connector height 1702 is a vertical distance from bottom and top sides of each of the connectors 202, where the bottom and top sides are directly on one of the conductive joints 130 and a bottom side of the integrated circuit 106, respectively. For example, the connector height 1702 can be a bump height.

Each of the conductive joints 130 includes a joint height 1704, denoted as B. The joint height 1704 is a vertical distance from bottom and top sides of each of the conductive joints 130, where the bottom and top sides are directly on one of the conductive pads 112 and one of the conductive joints 130, respectively. For example, the joint height 1704 can be a soldering height.

Each of the conductive pads 112 includes a pad thickness 1706, denoted as C. The pad thickness 1706 is a vertical distance from bottom and top sides of each of the conductive pads 112, where the top side is directly on one of the conductive joints 130, respectively. For example, the pad thickness 1706 can be a back-of-line (BOL) pad thickness.

Each of the conductive pads 112 includes a pad width 1708, denoted as D. The pad width 1708 is a horizontal distance from sidewalls of each of the conductive pads 112. For example, the pad width 1708 can be a back-of-line (BOL) pad width.

The cross-sectional view depicts the total gap height 206, denoted as E. The total gap height 206 is a sum of the connector height 1702 (A), the joint height 1704 (B), and the pad thickness 1706 (C).

Figure 18:
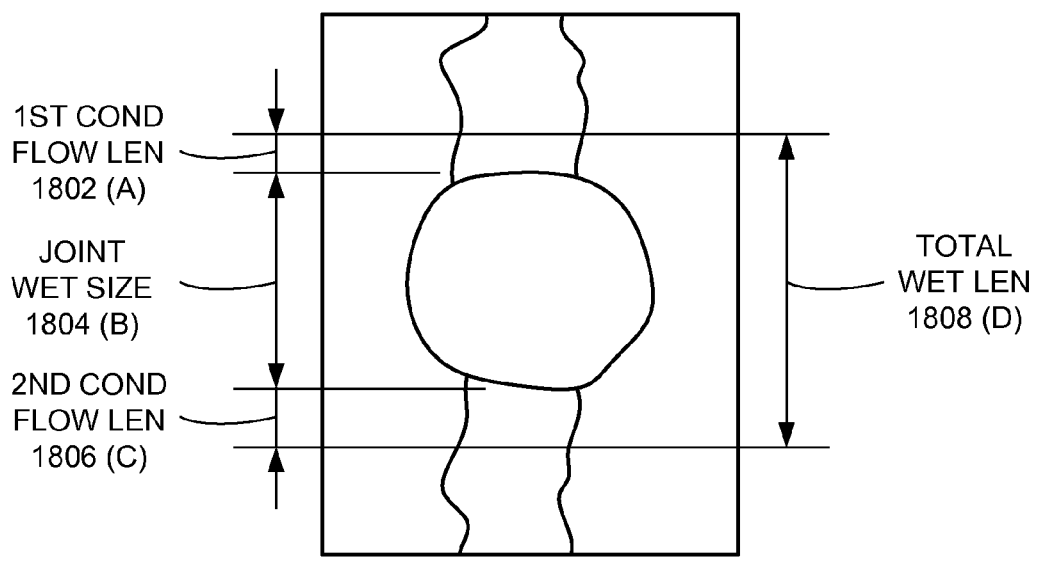
FIG. 18 is a top view of one of the conductive joints.

Referring now to FIG. 18, therein is shown a top view of one of the conductive joints 130. The top view depicts an example of a preparation method including planar polishing (P-Lapping) to check a number of dimensions. The preparation method includes, for example, the measurements using a sample size of 2 units (ea)/leg. The dimensions are for each of the conductive joints 130.

Each of the conductive joints 130 includes a first conductive flow length 1802, denoted as A, of the conductive joints 130. The first conductive flow length 1802 can represent a solder flow length. Each of the conductive joints 130 includes a joint wetting size 1804, denoted as B. Each of the conductive joints 130 includes a second conductive flow length 1806, denoted as C. The second conductive flow length 1806 can represent a solder flow length. A total wetting length, denoted as D, is a sum of dimensions A, B, and C.

Figure 19:
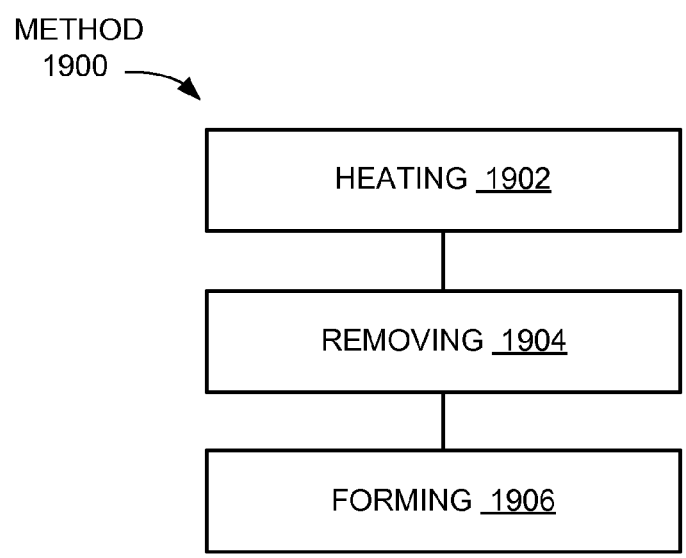
FIG. 19 is a flow chart of a method of manufacture of an integrated circuit packaging system in a further embodiment of the present invention.

Referring now to FIG. 19, therein is shown a flow chart of a method 1900 of manufacture of an integrated circuit packaging system in a further embodiment of the present invention. The method 1900 includes: heating a support structure having a conductive pad and an organic surface protection layer on the conductive pad in a block 1902; removing the organic surface protection layer from the conductive pad by a plasma process with a two-step method, the two-step method includes a first step with a dioxygen and a second step with a dihydrogen, wherein the second step immediately follows the first step in a block 1904; and forming an underfill over the conductive pad in a block 1906.

Thus, it has been discovered that the method of manufacture of the integrated circuit packaging system of the present invention furnishes important and heretofore unknown and unavailable solutions, capabilities, and functional aspects for an integrated circuit packaging system with plasma processing. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   heating a support structure having a conductive pad and an organic surface protection layer on the conductive pad;
   removing the organic surface protection layer from the conductive pad by a plasma process with a two-step method, the two-step method includes a first step with a dioxygen and a second step with a dihydrogen, wherein the second step immediately follows the first step; and
   forming an underfill over the conductive pad.

2. The method as claimed in claim 1 wherein removing the organic surface protection layer includes removing the organic surface protection layer with a force less than 90 newtons.

3. The method as claimed in claim 1 wherein removing the organic surface protection layer includes removing the organic surface protection layer by the plasma process with thermal compression.

4. The method as claimed in claim 1 wherein forming the underfill includes forming the underfill with a non-conductive paste.

5. The method as claimed in claim 1 further comprising forming a conductive joint directly on the conductive pad.

6. A method of manufacture of an integrated circuit packaging system comprising:
   heating a support structure having a conductive pad and an organic surface protection layer on the conductive pad;
   removing the organic surface protection layer from the conductive pad by a plasma process with a two-step method, the two-step method includes a first step with a dioxygen and a second step with a dihydrogen, wherein the second step immediately follows the first step;
   forming an underfill over the conductive pad; and
   mounting an integrated circuit over the support structure with the underfill in between the integrated circuit and the support structure.

7. The method as claimed in claim 6 wherein removing the organic surface protection layer includes removing the organic surface protection layer with a force less than or equal to 90 newtons.

8. The method as claimed in claim 6 wherein removing the organic surface protection layer includes removing the organic surface protection layer from the conductive pad by the plasma process with thermal compression, wherein the conductive pad includes copper.

9. The method as claimed in claim 6 wherein forming the underfill includes forming the underfill with a non-conductive paste directly on the conductive pad.

10. The method as claimed in claim 6 further comprising:
    forming a conductive joint directly on the conductive pad; and
    hardening the conductive joint.

11. A method of manufacture of an integrated circuit packaging system comprising:
    heating a support structure having a conductive pad and an organic surface protection layer on the conductive pad;
    removing the organic surface protection layer from the conductive pad by a plasma process with a two-step method, the two-step method includes a first step with a dioxygen and a second step with a dihydrogen, wherein the second step immediately follows the first step;
    forming an underfill over the conductive pad;
    mounting an integrated circuit over the support structure with the underfill in between the integrated circuit and the support structure; and
    forming a conductive joint directly on a connector of the integrated circuit and the conductive pad.

12. The method as claimed in claim 11 wherein removing the organic surface protection layer includes removing the organic surface protection layer with a force less than 90 newtons.

13. The method as claimed in claim 11 wherein removing the organic surface protection layer includes removing the organic surface protection layer by the plasma process with thermal compression.

14. The method as claimed in claim 11 wherein forming the underfill includes forming the underfill with a non-conductive paste.

15. The method as claimed in claim 11 further comprising forming a conductive joint directly on the conductive pad.

16. The method as claimed in claim 11 wherein heating the support structure includes the support structure having the organic surface protection layer with a chemical construction of Imidazole.

17. The method as claimed in claim 16 wherein removing the organic surface protection layer includes removing the organic surface protection layer with a force less than or equal to 90 newtons.

18. The method as claimed in claim 16 wherein removing the organic surface protection layer includes removing the organic surface protection layer from the conductive pad by the plasma process with thermal compression, wherein the conductive pad includes copper.

19. The method as claimed in claim 16 wherein forming the underfill includes forming the underfill with a non-conductive paste directly on the conductive pad.

20. The method as claimed in claim 16 further comprising hardening the conductive joint.

* * * * *